United States Patent [19]

Nakashima et al.

[11] Patent Number: 5,568,103
[45] Date of Patent: Oct. 22, 1996

[54] CURRENT CONTROL CIRCUIT OF RING OSCILLATOR

[75] Inventors: Teruya Nakashima, Kanagawa; Takehiko Umeyama, Hyogo, both of Japan

[73] Assignees: Mitsubishi Electric Engineering Co., Ltd.; Mitsubishi Denki Kabushiki Kaisha, both of Tokyo, Japan

[21] Appl. No.: 499,917

[22] Filed: Jul. 11, 1995

[30] Foreign Application Priority Data

Dec. 28, 1994 [JP] Japan ..................... 6-326974

[51] Int. Cl.⁶ ............... H03B 5/24; H03B 5/00; H03L 7/00; H03L 7/085
[52] U.S. Cl. .............. 331/185; 331/34; 331/57; 331/177 R
[58] Field of Search ............. 331/34, 57, 111, 331/116 FE, 143, 177 R, 185, DIG. 3; 327/108–112, 251, 530, 538, 543

[56] References Cited

U.S. PATENT DOCUMENTS

5,331,295 7/1994 Jelinek et al. .................. 331/57
5,410,278 4/1995 Itoh et al. .................. 331/57

Primary Examiner—David Mis
Attorney, Agent, or Firm—Oblon, Spivak, McClelland, Maier & Neustadt, P.C.

[57] ABSTRACT

A current control circuit of a ring oscillator is provided for use in the PLL oscillators. A current control circuit used in the ring oscillator comprises a first circuit having a first current source and a first transistor connected in series; a second circuit connected with the first circuit in parallel and having n second constant current sources and n second transistors connected in series, respectively, the second transistors are current mirrored with the first transistor in the first circuit, respectively; a third circuit connected with the first circuit in parallel and having a third transistor and a fourth transistor connected in series, the fourth transistor is current mirrored with the first transistor; n diodes connected to a connecting point of said third transistor and the fourth transistor for supplying currents to connecting points of n second constant current sources and the second transistor, respectively; an input terminal connected with the connecting point of the first constant current source and the first transistor.

18 Claims, 7 Drawing Sheets

CURRENT CONTROL CIRCUIT OF RING OSCILLATOR

BACKGROUND OF THE INVENTION

1. Field of the Invention

The invention relates to a current control circuit of a ring oscillator which is comprised of CMOS.

2. Description of the Prior Art

Figure 4:
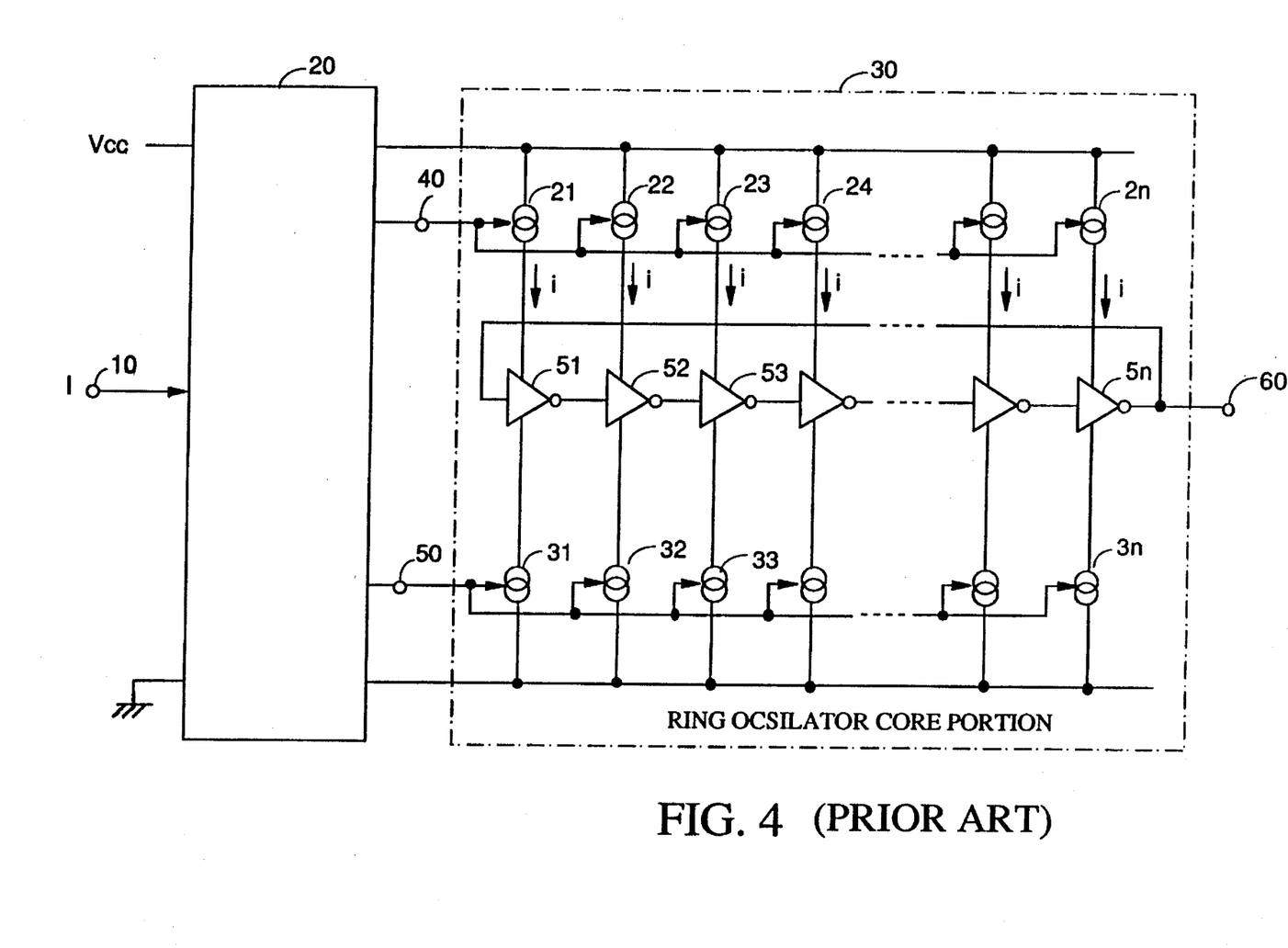
FIG. 4 is a circuit diagram of the conventional ring oscillator.
Figure 5:
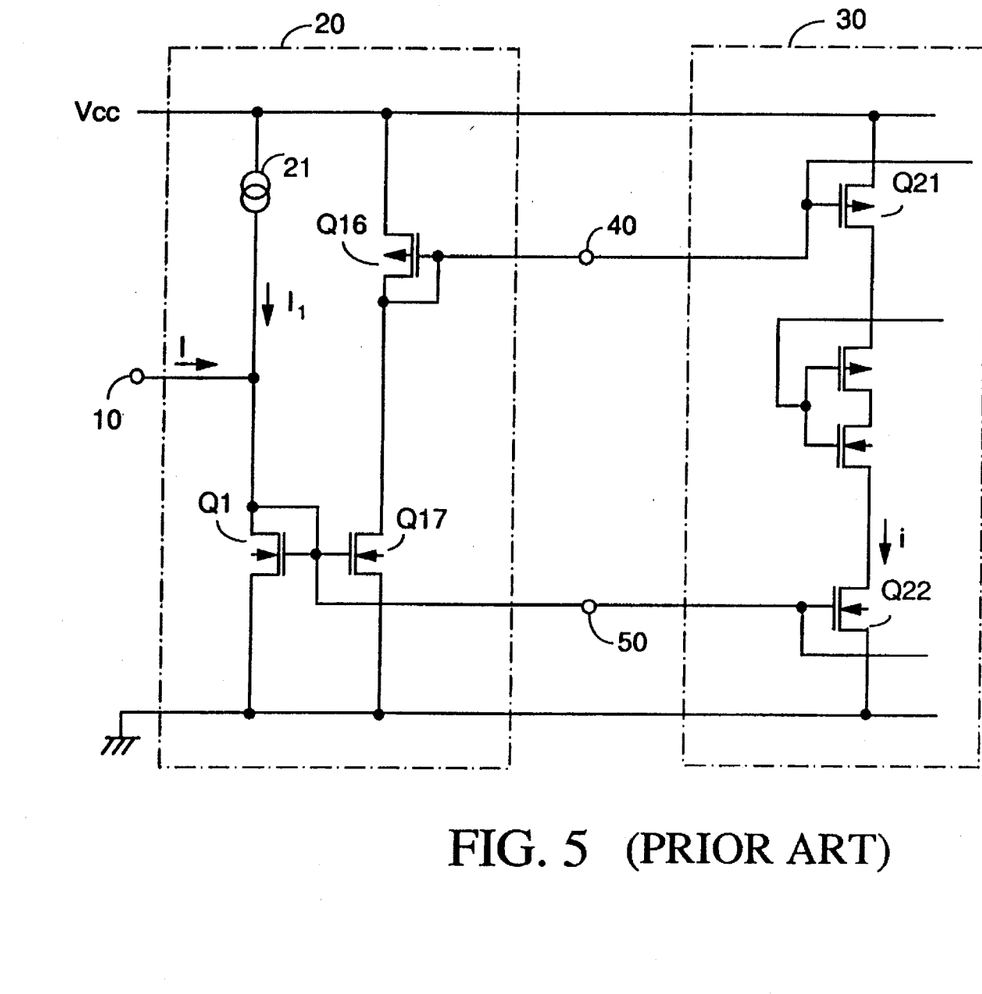
FIG. 5 is a circuit diagram showing a detailed circuit of the current control portion of the conventional CMOS ring oscillator.
Figure 6:
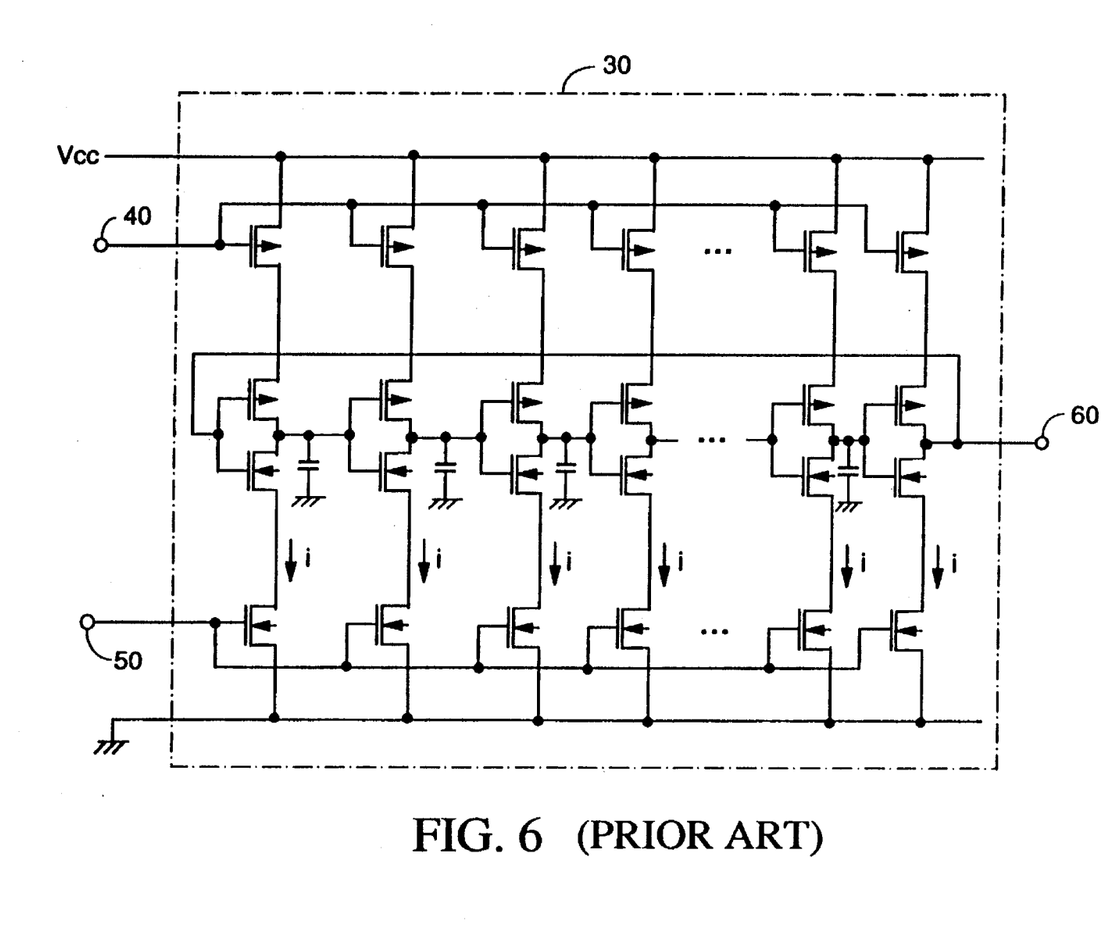
FIG. 6 is a circuit diagram showing a detailed circuit of the ring oscillator core portion of the conventional CMOS ring oscillator.

The ring oscillator circuit is comprised of a current control portion and a ring oscillator core portion. The ring oscillator core portion is comprised of odd number of inverters connected to each other in a ring shape and generates a clock signal. FIG. 4 shows a general block diagram of a conventional ring oscillator. FIG. 5 shows a detailed drawing of the conventional current control circuit. The current control circuit controls the clock oscillator frequency at the core portion 30 of the ring oscillator according to the input control current I. FIG. 6 is a detailed circuit diagram of the conventional ring oscillator core portions.

FIG. 7 explains an oscillation operation of the conventional ring oscillator circuit. FIG. 7 (a) shows a serial circuit of a constant current source and an inverter at a certain stage of the ring oscillator core portion in order to explain the oscillation principle of the ring oscillator. FIG. 7 (b) shows the delay time τ between an input signal and an output signal in each inverter. FIG. 7 (c) shows the relationship between the delay time τ and the current flowing in the inverter. FIG. 7 (d) shows the relationship between the oscillation frequency f and the current i flowing in the inverter.

Figure 7A:
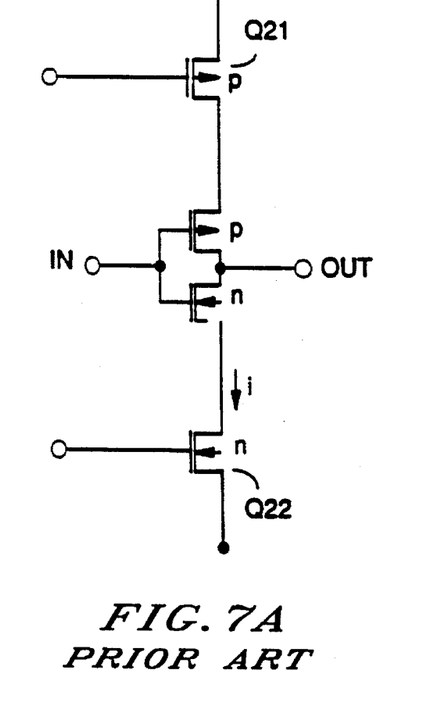
FIG. 7 is a diagram showing the oscillation principle of the conventional CMOS ring oscillator.
Figure 7B:
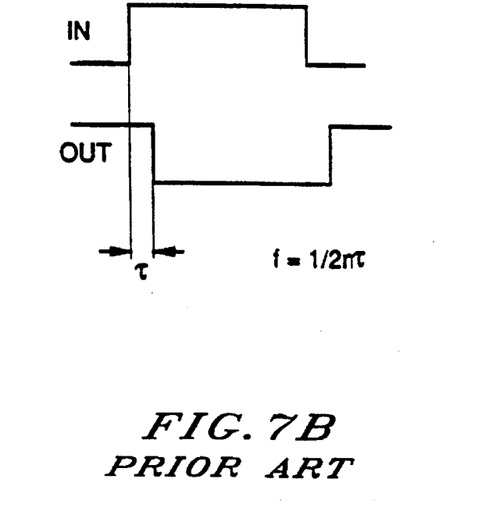

An operation of the ring oscillator is explained below. In FIG. 7 (a), the inverter is constituted of P-type MOS transistor and N-type MOS transistor and driven by the current sources connected to upper and lower portions thereof. In FIG. 7 (b), the output signal OUT of the inverter is delayed from the input signal IN by the delay time τ. The delay time τ is a function of the control current i of the inverter. This delay time τ decreases exponentially according to the current increase without being proportional to the current i.

Figure 7C:
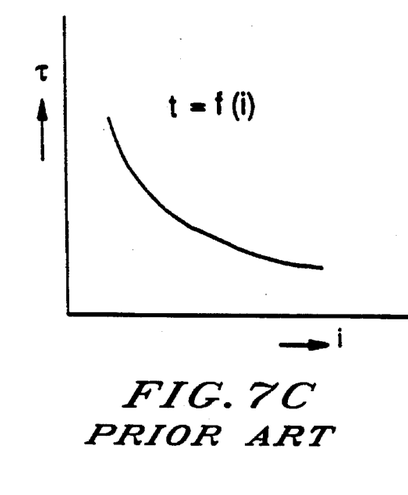
Figure 7D:
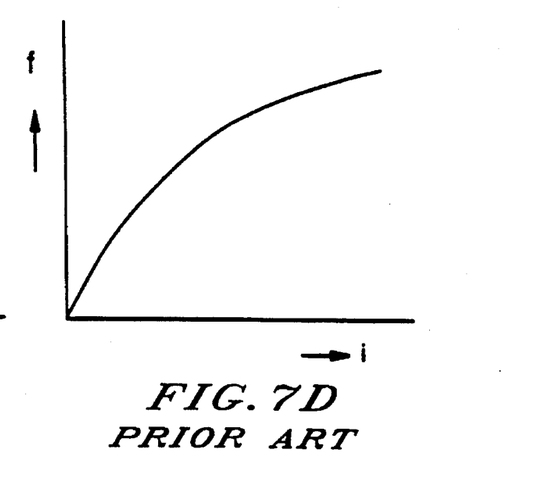

As shown in FIG. 4, the ring oscillator core portion 30 is comprised of a plurality of unit inverters arranged in parallel for n stages (odd numbered stages). The current sources 21–2n and 31–3n supply current i to the respective inverters (51–5n). These current sources are controlled by the input current I which is inputted from the input terminal 10 of the current control circuit portion 20. Assuming that the input terminal of the first stage inverter becomes H (logic level 1) during the current i flows in the inverter, L (logic level 0) is outputted to the output terminal 60 of the last stage inverter 5n after the delay time of nτ seconds. Since the output terminal is connected directly to the input terminal of the inverter 51, if the voltage of the input terminal becomes L, then voltage of both the output and input terminals becomes H after nτ seconds. Levels H and L are repeated in this way at the output terminal and then self-oscillation occurs. Since H and L levels are repeated for every nτ seconds, the oscillation frequency f is obtained such as f=½nτ. As shown in FIG. 7 (c), the delay time τ decreases when the current i flowing in the inverter increases, but its inclination becomes smaller when the current i increases. As shown in FIG. 7 (d), the frequency f therefore saturates when the current i increases.

Figure 3:
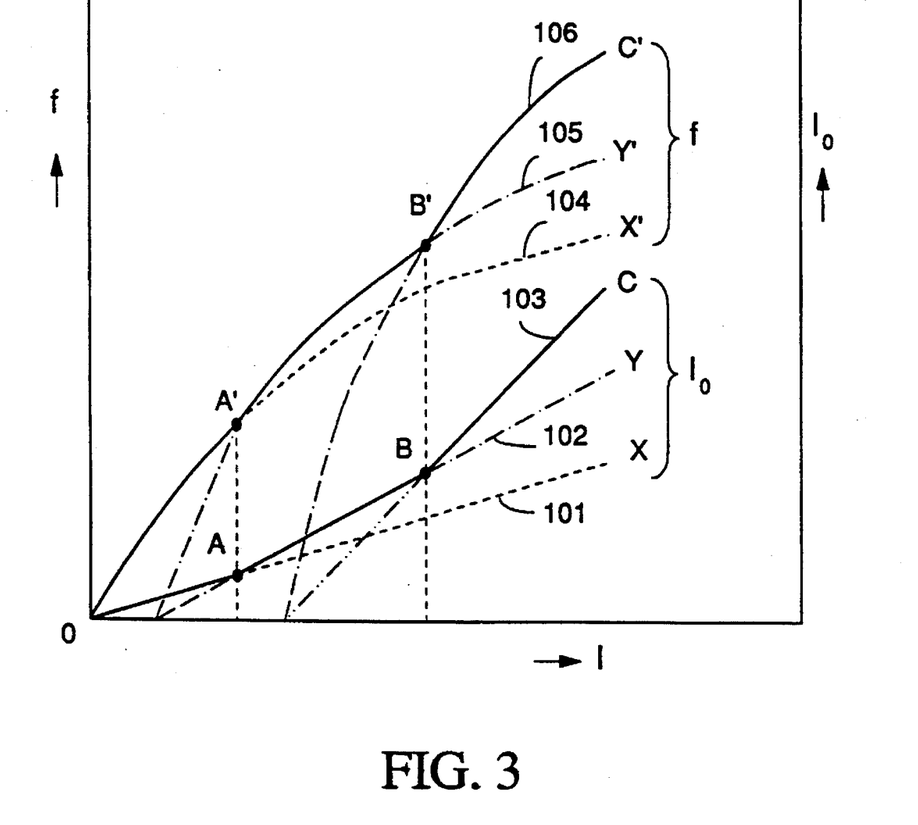
FIG. 3 shows frequency characteristics and current characteristics of the CMOS ring oscillator of the present invention and the conventional art.

FIG. 3 shows the relationship between the input control current I at the input terminal 10 of the current control circuit 20 and the output current $I_0$ (or $I_{10}$) from the current control circuit 20. FIG. 3 also shows the relationship between the input control current I and the output frequency f of the ring oscillator core portion. The dotted curve 101 in FIG. 3 shows characteristics of $I_0$ of the conventional ring oscillator. Since the current control circuit 20 of the conventional ring oscillator carries out the linear current control as will be discussed later, the frequency characteristics of the whole ring oscillators show a non-linear curve as shown in the dotted frequency curve 104.

The non-linearity of this frequency characteristics becomes larger as the delay time of the inverter becomes shorter, that is, the current becomes larger. In other words, the shorter the delay time τ and the higher the using frequency becomes, the worse the linearity of the frequency becomes. On the other hand, the longer the delay time τ and lower the using frequency, the better the linearity of the frequency characteristics becomes.

In the conventional current control portion 20 in FIG. 5, the difference of the current ($I_1$–I), which is obtained by subtracting input current I from the current $I_1$ supplied from the constant current source 21, flows through the drain of the transistor Q1. This current ($I_1$–I) is current mirrored to the transistor Q17. The current flowing in the transistor Q17 also flows in the drain of transistor Q16 simultaneously. The current flowing in this transistors Q16 and Q17 is current mirrored to the transistors Q21 and Q22 of the constant current source inside the ring oscillator core portion 30 via the output terminals 40 and 50, respectively.

In the conventional current control circuit, the input control current I has a linear relationship with the output current $I_0$ (the current for controlling the constant current source in the ring oscillator core portion by the current mirror). Since the ring oscillator core portion 30 is controlled by the linear current, the frequency characteristics of the ring oscillator has non-linear characteristics as shown by the dotted line 104 of FIG. 3.

When said ring oscillator is used in the phase-locked loop (PLL), the non-linearity of frequency/current characteristics of the ring oscillator causes a variation of the cut-off frequency of the loop and a drift of the phase margin, which results in gain peaking or extreme gain decrease. According to the gain peaking or gain decrease, the follow-up to the loop becomes sensitive or impossible which makes the jitter drift. In PLL circuit, when the gain varies in the loops, the jitter drifts because of the phase characteristics of the loop (phase margin) and such.

SUMMARY OF THE INVENTION

It is an object of the present invention to compensate the gain variation of frequency versus current when a ring oscillator is used for phase locked loop (PLL). That is, it is an object of the present invention to provide a current control circuit used for the ring oscillator having a linear frequency characteristics.

It is further object of the present invention to get good frequency characteristics which are close to linear for all frequency band from a low frequency to a high frequency.

It is further object of the present invention to get good frequency characteristics which are close to linear for all frequency band from a low frequency to a high frequency, since each second constant current source in the second circuit is controlled by the different current values which increase one after another.

It is further object of the present invention to get good frequency characteristics which are close to linear for all frequency band from a low frequency to a high frequency, since the current mirror ratio of the first and the second transistors is set to one or any other arbitrary value except one.

It is further object of the present invention to get good frequency characteristics which are close to linear for all frequency band from a low frequency to a high frequency, since the current mirror ratio of the first and the fourth transistors is set to one or any other arbitrary value except one.

It is further object of the present invention to get good frequency characteristics which are close to linear for all frequency band from a low frequency to a high frequency, since the current mirror ratio of the sixth and the eighth transistors is set to one.

In order to obtain the above object, a current control circuit of the present invention comprises a first circuit having a first current source and a first transistor connected in series; a second circuit connected with the first circuit in parallel and having n second constant current sources and n second transistors connected in series, respectively, the second transistors are current mirrored with the first transistor in the first circuit, respectively; a third circuit connected with the first circuit in parallel and having a third transistor and a fourth transistor connected in series, the fourth transistor is current mirrored with the first transistor; n diodes connected to a connecting point of said third transistor and the fourth transistor for supplying currents to connecting points of n second constant current sources and the second transistor, respectively; an input terminal connected with the connecting point of the first constant current source and the first transistor.

Second, the present invention further comprises a fourth circuit connected with the first circuit in parallel and having a fifth transistor and a sixth transistor connected in series, the fifth transistor is current mirrored with the third transistor; an output terminal connected with the fifth transistor and the sixth transistor, respectively, for supplying currents to the ring oscillator core portion.

Third, the present invention further comprises a fourth circuit connected with the first circuit in parallel and having a fifth transistor and a sixth transistor connected in series, the fifth transistor is current mirrored with the third transistor; a fifth circuit connected with the first circuit in parallel and having a seventh transistor and an eighth transistor connected in series, the eighth transistor is current mirrored with the sixth transistor; output terminals connected with the seventh transistor and the eighth transistor, respectively, for supplying currents to the ring oscillator core portion.

Preferably, each second constant current source in the second circuit is controlled by the different current values which increase one after another.

Preferably, the current mirror ratio of the first and the second transistors is set to one or any other arbitrary value except one.

Preferably, the current mirror ratio of the first and the fourth transistors is set to one or any other arbitrary value except one.

Preferably, the current mirror ratio of the sixth and the eighth transistors is set to one.

DETAILED DESCRIPTION OF THE PREFERRED EMBODIMENTS

Embodiment 1

Figure 1:
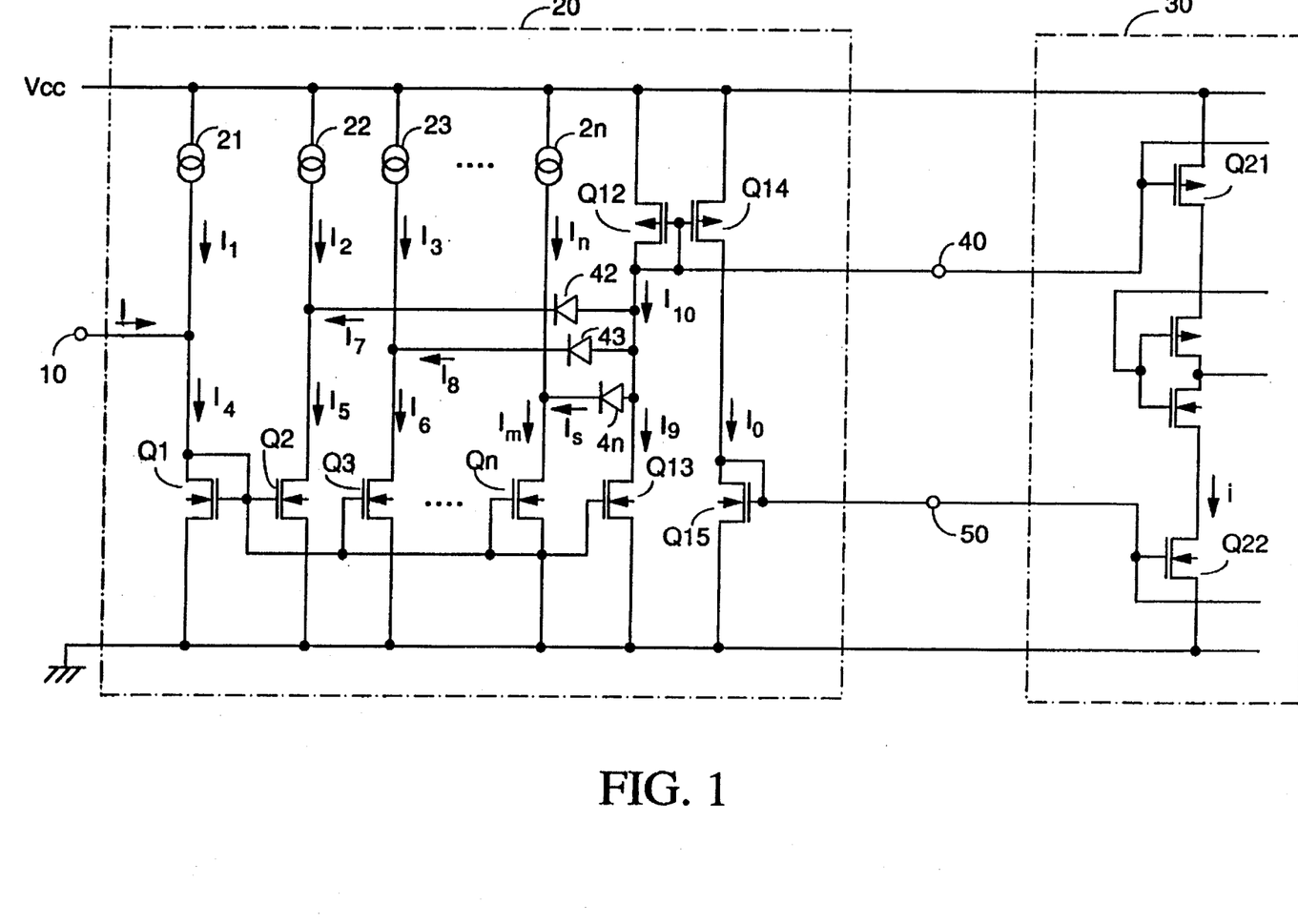
FIG. 1 is a circuit diagram showing a current control circuit of CMOS ring oscillator of an embodiment of the present invention.

FIG. 1 shows a current control circuit of a first embodiment of the present invention. In FIG. 1, the numeral 10 denotes an input terminal, the numeral 20 denotes a current control circuit portion, the numeral 30 denotes a ring oscillator core portion, the numerals 21, 22 . . . 2n denote a constant current source, Q1, Q2, Q3 . . . Qn and also Q12, Q13 . . . Q15 are transistors and 42, 43 . . . 4n are diodes.

The control current I inputted into the input terminal 10 is added to the current $I_1$ which flows through the constant current source 21 to become $I_4$ ($I_4=I_1+I$) and the current $I_4$ flows through the transistor Q1. The current $I_4$ is current mirrored from the transistor Q1 to the transistors Q2, Q3 . . . Qn, Q13 and then changed $I_5$, $I_6$ . . . $_m$, $I_9$ through the respective transistors Q2, Q3 . . . Qn, Q13. Where $I_4$ can be equal to $I_5$, $I_6$ . . . $I_m$, $I_9$ or different by a voluntary ratio.

Further, the transistors Q2, Q3 . . . Qn are connected to the constant current sources 22, 23 . . . 2n, respectively, to supply constant currents to the respective transistors from these constant current sources. Diodes 42, 43 . . . 4n are connected to the drains of the respective transistors Q2, Q3 . . . Qn to supply the currents exceeding a predetermined currents $I_2$, $I_3$ . . . $I_n$ from the transistor Q12 to the transistors Q2, Q3 . . . Qn, respectively. Therefore, the transistors Q2, Q3 . . . Qn are supplied with the combined currents $I_2$, $I_3$ . . . $I_n$ and $I_7$, $I_8$ . . . $I_s$, that is, the currents $I_5$ ($=I_2+I_7$), $I_6$ ($=I_3+I_8$) . . . $I_m$ ($=I_n+I_s$) flow through the respective transistors Q2, Q3 . . . Qn. On the other hand, the drain current $I_{10}$ of the transistor Q12 becomes a sum ($I_{10}=I_9+I_7+I_8+ \ldots +I_s$) of the drain current $I_9$ of transistor Q13 and the current $I_7$, $I_8$ . . . $I_s$ flowing through diodes 42, 43 . . . 4n.

The output current $I_0$ flowing through the transistors Q14 and Q15 is current mirrored by the current $I_{10}$ which flows transistor Q12. When the input control current I increases linearly, the drain currents $I_5$, $I_6$ . . . $I_m$ and $I_9$ flowing through the respective transistors Q2, Q3 . . . Qn and Q13 increase linearly, too. On the other hand, the drain currents $I_5$, $I_6$ . . . $I_m$ flowing through the transistors Q2, Q3 . . . Qn are set so that the drain currents $I_5$, $I_6$ . . . $I_m$ flowing through the transistors Q2, Q3 . . . Qn is larger than the currents supplied by the constant current sources 22, 23, . . . 2n. When the currents $I_5$, $I_6$ . . . $I_m$ exceed $I_2$, $I_3$ . . . $I_n$, respectively, the sufficient currents may not be supplied from the constant current sources 22, 23, . . . 2n. In that case, the currents $I_7$, $I_8 \ldots I_S$ are supplied via diodes 42, 43 . . . 4n.

When the current $I_7$, $I_8$, . . . $I_S$ are supplied from the transistor Q12, the current $I_{10}$ increases such as ($I_9+I_7$, $I_8 \ldots I_S$). The current $I_{10}$ is current mirrored from the transistors Q12 to the transistors Q14 and changes to a current $I_0$. The current $I_0$ begins to increase at the moment when the current begins to flow into the diodes 42, 43, . . . 4n. FIG. 3 showing this status.

Figure 2:
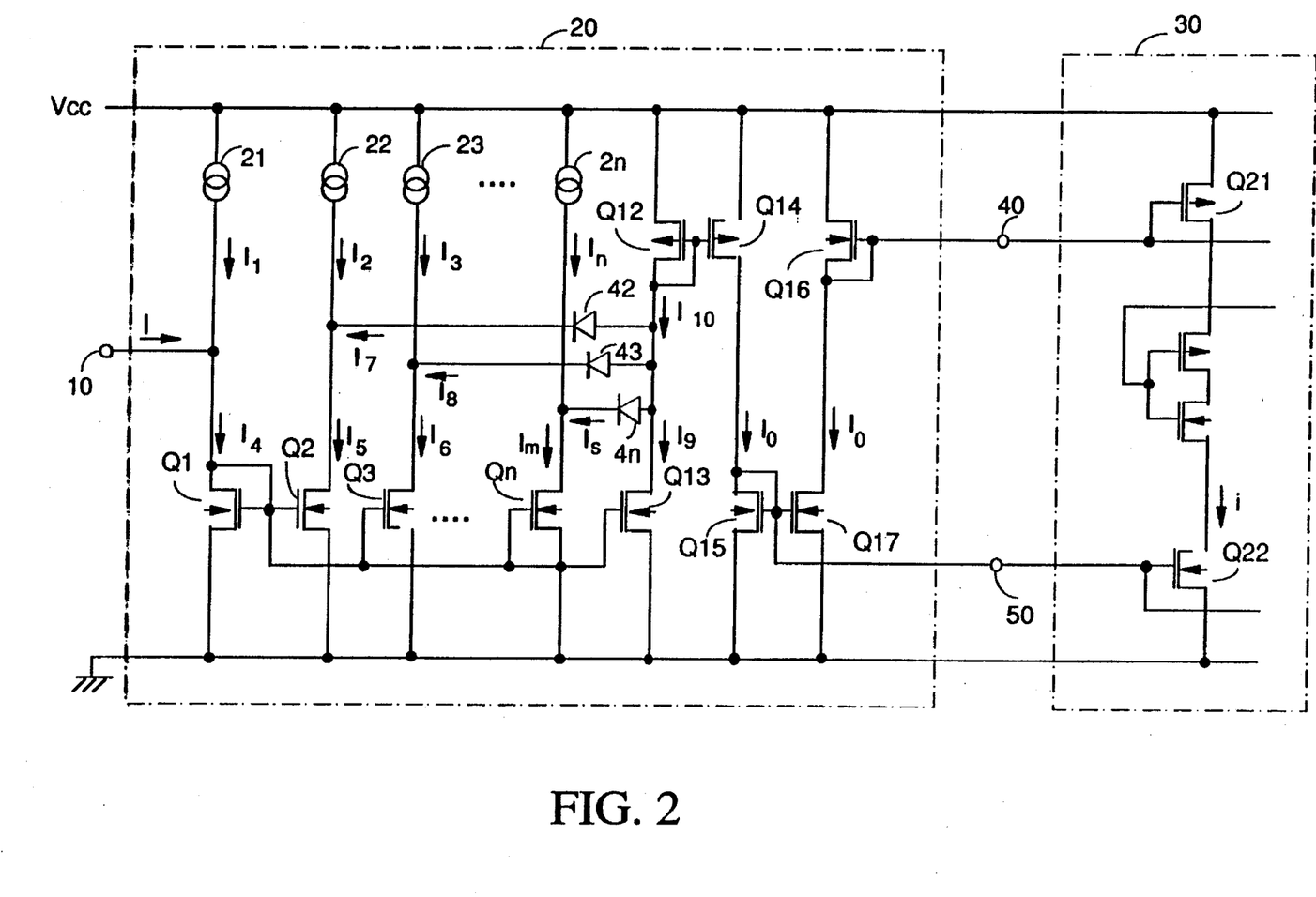
FIG. 2 is a circuit diagram showing a current control circuit of CMOS ring oscillator of another embodiment of the present invention.

In FIG. 3, the current $I_0$ has two turning points (A, B) and it becomes a straight line which turns at the points (A, B) in the case of FIG. 2. By setting the curve (O-A-B-C) so that each slope of the drain current $I_0$ becomes larger than others one after another at each turning points (A, B), the oscillation frequency also becomes a curve (O-A'-B'-C') having two turning points (A', B'), then, f-I characteristics are compensated toward more linear characteristics. Further, by increasing the number of the turn points, f-I characteristics are compensated to be a close line having more good linearity.

Further explanation on the above is made here using FIG. 1. In FIG. 1, the current shown by arrow is assumed to be forward direction. Assuming that the current $I_4$ flowing in the transistor Q1 becomes $I_4=I_1+I$ and the current $I_9$ becomes $I_9=\beta \times I_4$ if the current $I_9$ is current mirrored by $\beta$ times for $I_4$. By ignoring the currents $I_7$, $I_8$, . . . $I_S$, the current $I_{10}$ becomes $I_{10}=I_9$. Also, the current $I_0$ is current mirrored by $\alpha$ times for $I_{10}$, that is, the current $I_0$ becomes $I_0=\alpha \times I_{10}$. In other words, the current $I_0=\alpha \times I_{10}$ shows a first dotted straight line 101 (0-A-X) and the current I becomes a current $I_0$ which is supplied to the ring oscillator core portion from zero to the turning point A.

Next, by assuming the current $I_5$ is current mirrored by C times for $I_4$, the current $I_5=C \times I_4$. In other words, the current $I_5$ increases by C times for the increase of $I_4$. When the current I becomes larger and the current $I_5$ exceeds a point equivalent to the turning point A, the current source 22 cannot supply further current greater than $I_2$. Therefore, the current exceeding $I_2$ is supplied as a current $I_7$ from the transistor Q12 to transistor Q2 through diodes 42. In other words, the current $I_5$ is supplied by the current $I_2$ and the current $I_7$ between the turning points A and B.

In other words, the current $I_2$ is supplied to the transistor Q2 until the current $I_5$ becomes up to a predetermined current $I_2$ from zero current. However, when the current $I_5$ exceeds the predetermined current $I_2$, that is, $I_5 > I_2$, no further current is supplied from the constant current source 22. Therefore, only the current $I_7$ ($I_7=I_5-I_2$) which exceeds the current $I_2$ is supplied from the transistor Q12 to transistor Q2 through diodes 42. Therefore, the current $I_5$ is obtained such as $I_5=I_2+I_7$. At the turning point A, $I_5$ becomes equal to $I_2$. On the first dotted straight line 101, the current $I_9$ increases from zero to the turning point A according to the relationship of ($\beta \times I_4$).

After the point where the current $I_7$ begins to flow, the current $I_{10}$ becomes a sum ($I_{10}=I_7+I_9$) of the currents $I_7$ and $I_9$. That is, although the current $I_{10}$ is equal to $I_9$ on the straight line 101, but the current $I_{10}$ begins to increase such as $I_{10}=I_7+I_9$ after the turning point B. Therefore, the straight line 101 changes to a second straight chain line 102 (A-B-Y) having a steeper slope at the point A where the current $I_7$ begins to increase. After the turning point B, the current $I_{10}$ is obtained such as $I_{10}=I_7+I_9$ and the current $I_0$ is current mirrored by the current $I_{10}$ and becomes such as $I_0=\alpha \times (I_7+I_9)$.

In the similar way as described above, the current $I_3$ is supplied to the transistor Q3 by the constant current source 23. During $I_6<I_3$, the current $I_6$ is supplied only by the constant current source 23. However, if the current I becomes larger and then $I_6$ exceeds the turning point B, that is, the point where $I_6=I_3$, no more current can be supplied from the constant current source 23. Therefore, the current $I_8$ ($I_8=I_6-I_3$) which exceeds the current $I_3$ is then supplied through diodes 43 to transistor Q3. In other words, the current $I_{10}$ becomes $I_{10}=I_7+I_8+I_9$ after the turning point B. The current $I_{10}$ is current mirrored from the transistor Q12 to the transistor Q14 and the current $I_0$ flows through the transistor Q14. This current $I_0$ becomes such as $I_0=\alpha \times (I_9+I_7+I_8)$.

To sum up the above, when the current $I_4$ gradually increases from 0 ($I=-I_1$), the current $I_0$ is obtained such as $I_0=\alpha \times I_9$ until the turning point A and $I_0=\alpha \times (I_9+I_7)$ between the turning point A and B and $I_0=\alpha \times (I_9+I_7+I_8)$ after the turning point B as shown by a third solid line 103 (B-C) having a steeper slope. When the current I increases from zero, the locus of the current $I_0$ becomes a polygonal line (0-A-B-C) combined with three lines $\alpha \times I_9$, $\alpha \times (I_9+I_7)$, and $\alpha \times (I_9+I_7+I_8)$.

When the current $I_0$ is on the straight line 101, the frequency f begins to saturate near the turning point A' as shown by the frequency curve 104. When the current $I_0$ moves to the straight line 102 at such a point A, then the frequency is moved to the frequency curve 105, which has a higher saturation area than the frequency curve 104. However, the frequency curve 105 also begins to saturate near the turning point B'. Further, when the current $I_0$ moves to the third straight line 103, the frequency moves to the frequency curve 106 which has a higher saturation area than the frequency curve 105. In other words, when the current I increases, the current $I_0$ which controls the ring oscillator core portion increases along the polygonal line (0-A-B-C) and the frequency curve also increases along the polygonal line (0-A'-B'-C') which is combined with several frequency curves each having different slope. The frequency curve (0-A'-B'-C') combined in this way is not much influenced by saturation. Therefore, the polygonal line (0-A'-B'-C') has an improved linear characteristics compared with the conventional frequency curve 104.

By supplying the currents which exceed the respective setting points of the constant current sources 22, 23 . . . 2n from the transistor Q12 to the transistors Q2, Q3, . . . Qn through the diodes 42, 43 . . . 4n, a current $I_0$ having a larger slope than that of the current I can be obtained. This current $I_{10}$ is current mirrored from the transistor Q12 to the transistor Q14 to obtain a current $I_0$. The current $I_{10}$ is further supplied from the transistor Q12 to the transistor Q21 in the ring oscillator core portion 30 through the terminal 40 by current mirror function. And also the current $I_0$ which flows in the transistor Q15 is supplied to the transistor Q22 in the ring oscillator core portion 30 through the terminal 50 by current mirror function.

As explained in the FIG. 7 (c), (d), since the invention enables to increase the current which is supplied to each inverter of the ring oscillator core portion 30, the delay time τ can be shortened and the oscillation frequency can be increased. Thereby, the problem is solved in which the conventional method can not obtain a sufficient frequency characteristics because of the saturation occurred when the control current I increased.

The linearity of the frequency characteristics can be further improved by increasing the number of the turning points. Although a case having several turning points is explained above using general formulas, a brief explanation is added here again about the construction of a current control circuit which increases the turning points for a better understanding. In other words, in order to add the nth turning point, an nth constant current source $2n$, a transistor Qn and a diode $4n$ are added as shown in FIG. 1. Assuming the current of the constant current source to be In, the current of the nth turning point becomes $I_n = I_m$. Accordingly, when the current $I_n$ of the transistor Qn, which is current mirrored with the transistor Q1 becomes such as $I_n < I_m$, the current $I_S$ which exceeds the current $I_n$ is supplied from the transistor Q12 through diodes $4n$. In this case, the nth current curve n becomes $I_0 = A(I_9 + I_7 + \ldots I_5 + I_8)$ which causes the frequency curve to have better linearity in response to the current $I_0$. When combining a lot of frequency curves in this way, the current control circuit having a good linearity may be obtained even if the current I is larger, that is, even if the frequency is higher.

As mentioned above, the object of the present invention is to change the frequency curve from the saturated frequency curve (0–A'–X') as shown in FIG. 3 to a frequency curve (0–A'–B'–C') as shown in FIG. 3 in order to obtain a straight line frequency characteristics. However, if too much correction is made, that is, if the current mirror ratios of the currents $I_5$, $I_6$ for the current $I_4$ are too large, the slopes of the frequency curves become too steep at turning points A' and B' which makes the compensation too much. On the contrary, if the current mirror ratio is too small, the slopes of the frequency curves become too small to make enough compensation. Therefore, the number of the turning points is suitably selected depending on the frequency f. That is, if the frequency is higher, the number of the turning point are increased. When numbers of combination of the constant current sources and transistors are increased, more accurate straight line correction can be possible.

Embodiment 2

FIG. 2 shows a current control circuit of CMOS ring oscillator in another embodiment of the present invention. FIG. 2 is different from the first embodiment in that one more current mirror circuits are added in order to supply currents to the ring oscillator core portion. In the second embodiment, the current $I_0$ is current mirrored from the transistor Q15 to the transistor Q17 by a current mirror ratio 1. The current $I_0$ is supplied from the transistor Q15 to the transistor Q22 in the ring oscillator core portion 30 through the terminal 50 by the mirror function. The current $I_0$ which flows in the transistor Q16 is also supplied from the transistor Q16 to the transistor Q21 in the ring oscillator core portion 30 through the terminal 40 by the mirror function.

What is claimed is:

1. A current control circuit of a ring oscillator comprising:

a first circuit having a first current source and a first transistor connected in series;

a second circuit connected with said first circuit in parallel and having at least one second constant current sources and at least one second transistor connected in series, said at least one second transistor being current mirrored with said first transistor;

a third circuit connected with said first circuit in parallel and having a third transistor and a fourth transistor connected being current mirrored with said first transistor;

at least one diode element connected to a connecting point of said third transistor and said fourth transistor for supplying current to connecting points of the second transistor;

an input terminal connected with the connecting point of said first constant current source and said first transistor; and a fourth circuit connected with said first circuit in parallel and connected with an output terminal for supplying current.

2. The current control circuit of the ring oscillator of claim 1, wherein said fourth circuit includes a fifth transistor and a sixth transistor connected in series, said fifth transistor being current mirrored with the third transistor; and wherein said output terminal includes a first output node connected with said third transistor and a second output node connected with said sixth transistor.

3. The current control circuit of the ring oscillator of claim 1, wherein said fourth circuit includes a fifth transistor and a sixth transistor connected in series, and a seventh transistor and an eight transistor connected in series, said fifth transistor being current mirrored with said third transistor and wherein said output terminal includes a first output node connected with said seventh transistor and a second output node connected with said sixth transistor.

4. The current control circuit of the ring oscillator of any one of claims 1, 2 or 3, wherein each second constant current source in the second circuit is controlled by different current values which increase one after another.

5. The current control circuit of the ring oscillator of any one of claims 1, 2 or 3, wherein the current mirror ratio of the first and the second transistors is set to any arbitrary value.

6. The current control circuit of the ring oscillator of any one of claims 2 or 3, wherein the current mirror ratio of the first and the fourth transistors is set to any arbitrary value.

7. The current control circuit of the ring oscillator of claim 3, wherein the current mirror ratio of the sixth and the eighth transistors is set to one.

8. A current control circuit comprising;

a first circuit comprising a first current source which provides a first constant current from a current supply node and a first N-type MOS transistor whose drain electrode is connected to the current supply node of said first current source and an input terminal, whose source electrode is connected to a ground potential node, and whose gate electrode and the drain electrode are connected in common; a second circuit comprising a second current source which provides a second constant current from a current supply node and a second N-type MOS transistor which is connected between the current supply node of said second current source and said ground potential node, wherein a gate electrode of said second N-type MOS transistor is connected to the gate electrode of said first N-type MOS transistor;

a third constant circuit comprising a first P-type MOS transistor and a third N-type MOS transistor, wherein a drain electrode of said first P-type MOS transistor is connected to a power supply potential node, a gate electrode and source electrode of said first P-type MOS transistor are connected commonly to a first output node, said third N-type, MOS transistor is connected between the source electrode of said first P-type MOS transistor and said ground potential node, and the gate electrode of said third N-type MOS transistor is connected to a gate electrode of said flat N-type MOS transistor; and a diode element wherein an anode electrode is connected to source electrode of said first P-type MOS transistor and a cathode electrode is connected to the drain electrode of said second N-type MOS transistor.

9. The current control circuit of claim 8, further comprising:

fourth circuit comprising a second P-type MOS transistor and a fourth N-type MOS transistor, wherein a drain electrode of said second P-type MOS transistor is connected to said power supply potential node, a gate electrode of said second P-type MOS transistor is connected to the gate electrode of said first P-type MOS transistor, a drain electrode of said fourth N-type MOS transistor is connected to the source electrode of said second P-type MOS transistor, a source electrode of said fourth N-type MOS transistor is connected to said ground potential node, a gate electrode and a drain electrode of said fourth N-type MOS transistor is commonly connected to a second output node.

10. The current control circuit of claim 8, further comprising:

a fourth circuit comprising a second P-type MOS transistor and a fourth N-type MOS transistor, wherein a drain electrode of said second P-type MOS transistor is connected to said power supply potential node, a drain electrode of said fourth N-type MOS transistor is connected to source electrode of said second P-type MOS transistor, a source electrode of said fourth N-type MOS transistor is connected to said ground potential node, a gate electrode and a drain electrode of said fourth N-type MOS transistor are connected commonly to a second output node, and a fifth circuit comprising a third P-type MOS transistor and a fifth N-type MOS transistor, wherein a drain electrode of said third P-type MOS transistor is connected to said power supply potential node, said fifth N-type MOS transistor is connected between the source electrode of said third P-type MOS transistor and said ground potential node, a gate electrode and a source electrode of said third P-type MOS transistor is connected commonly to a first output node, and a gate electrode of said fifth N-type MOS transistor is connected commonly to the gate electrode of said fourth N-type MOS transistor.

11. A current control circuit comprising;

a first circuit comprising a first current source which provides a first constant current from a current supply node and a first N-type MOS transistor, wherein a drain electrode of said first N-type MOS transistor is connected to the current supply node of said first current source and an input terminal, a source electrode of said first N-type MOS transistor is connected to a ground potential node, and a gate electrode and the drain electrode of said first N-type MOS transistor are connected in common;

a second circuit comprising a plurality of stages each of which comprises a second current source providing a second constant current from a current supply node and a second N-type MOS transistor, wherein said second N-type MOS transistor is connected between the current supply node of said second current source and said ground potential node, and a gate electrode of said second N-type MOS transistor is connected to the gate electrode of said first N-type MOS transistor;

a third constant circuit comprising a first P-type MOS transistor and a third N-type MOS transistor, wherein a drain electrode of said first P-type MOS transistor is connected to a power supply potential node, a gate electrode of said first P-type MOS transistor is connected to a first output node; a drain electrode and said gate electrode of said first P-type MOS transistor are connected in common, said third N-type MOS type transistor is connected between source electrode of said first P-type MOS transistor and said ground potential node, and a gate electrode of said third N-type MOS transistor is connected to a gate electrode of said first N-type MOS transistor; and a plurality of diode elements, whose each anode electrode is connected to the source electrode of said first P-type MOS transistor and whose cathode electrode is connected to a drain electrode of said corresponding second N-type MOS transistor.

12. The current control circuit of claim 11, further comprising:

a fourth circuit comprising a second P-type MOS transistor and a fourth N-type MOS transistor, wherein a drain electrode of said second P-type MOS transistor is connected to said power supply potential node, a gate electrode of said second P-type MOS transistor is connected to a gate electrode of said first P-type MOS transistor, a drain electrode of said fourth N-type MOS transistor is connected to a source electrode of said second P-type MOS transistor, a source electrode of said fourth N-type MOS transistor is connected to said ground potential node, a gate electrode and a drain electrode of said fourth N-type MOS transistor is connected commonly to a second output node.

13. The current control circuit of claim 11, further comprising:

a fourth circuit comprising a second P-type MOS transistor and a fourth N-type MOS transistor, wherein a drain electrode of said second P-type MOS transistor is connected to said power supply potential node, a drain electrode of said fourth N-type MOS transistor is connected to source electrode of said second P-type MOS transistor, a source electrode of said fourth N-type MOS transistor is connected to said ground potential node, a gate electrode and a drain electrode of said fourth N-type MOS transistor are connected commonly to a second output node, and a fifth circuit comprising a third P-type MOS transistor and a fifth N-type MOS transistor, wherein a drain electrode of said third P-type MOS transistor is connected to said power supply potential node, said fifth N-type MOS transistor is connected between the source electrode of said third P-type MOS transistor and said ground potential node, a gate electrode and a source electrode of said third P-type MOS transistor is connected commonly to a first output node, and a gate electrode of said fifth N-type MOS transistor is connected commonly to the gate electrode of said fourth N-type MOS transistor.

14. The current control circuit of claim 11, wherein each second constant current from said second current source in each stage of said second circuit has different value.

15. A ring oscillator comprising a current control circuit and a ring oscillator core portion, said current control circuit comprising:

a first circuit comprising a first current source which provides a first constant current from a current supply node and a first N-type MOS transistor whose drain electrode is connected to the current supply node of said first current source and an input terminal, whose source electrode is connected to a ground potential node, and whose gate electrode and the drain electrode are connected in common;

a second circuit comprising a second current source which provides a second constant current from a current supply node and a second N-type MOS transistor which is connected between the current supply node of said second current source and said ground potential node, wherein a gate electrode of said second N-type MOS transistor is connected to the gate electrode of said first N-type MOS transistor;

a third constant circuit comprising a first P-type MOS transistor and a third N-type MOS transistor, wherein a drain electrode of said first P-type MOS transistor is connected to a power supply potential node, a gate electrode and source electrode of said first P-type MOS transistor are connected commonly to a first output node, said third N-type MOS transistor is connected between the source electrode of said first P-type MOS transistor and said ground potential node, and the gate electrode of said third N-type MOS transistor is connected to a gate electrode of said first N-type MOS transistor;

a diode element wherein an anode electrode is connected to source electrode of said first P-type MOS transistor and a cathode electrode is connected to the drain electrode of said second N-type MOS transistor; and a fourth circuit comprising a second P-type MOS transistor and a fourth N-type MOS transistor, wherein a drain electrode of said second P-type MOS transistor is connected to said power supply potential node, a gate electrode of said second P-type MOS transistor is connected to the gate electrode of said first P-type MOS transistor, said fourth N-type MOS transistor is connected between the source electrode of said second P-type MOS transistor and said ground potential node, a gate electrode and a drain electrode of said fourth N-type MOS transistor is commonly connected to a second output node, and said ring oscillator core portion comprising odd number of inverter means, each inverter means comprising;

a third P-type MOS transistor whose drain electrode is connected to said power supply potential node and whose gate electrode is connected to the first output node of said current control circuit, a fourth P-type MOS transistor which is connected between the source electrode of said third P-type MOS transistor and output node of each inverter means;

a fifth N-type MOS transistor whose drain electrode is connected to the output node of each inverter means and whose gate electrode is connected to the gate electrode of said fourth P-type MOS transistor; and a sixth N-type MOS transistor connected between a source electrode of said fifth N-type MOS transistor and said ground potential node, a gate electrode of the sixth N-type MOS transistor is connected to the second output node of said current control circuit, wherein a gate electrode of fourth P-type MOS transistor and a gate electrode of fifth N-type MOS transistor of a first stage inverter means are connected to an output node of a last stage inverter means, a gate electrode of fourth P-type MOS transistor and a gate electrode of fifth N-type MOS transistor of succeeding stage of inverter means are connected to an output node of preceding stage of each inverter means.

16. A ring oscillator comprising a current control circuit and a ring oscillator core portion, said current control circuit comprising:

a first circuit comprising a fnt current source which provides a first constant current from a current supply node and a first N-type MOS transistor, wherein a drain electrode of said first N-type MOS transistor is connected to the current supply node of said first current source and an input terminal, a source electrode of said first N-type MOS transistor is connected to a ground potential node, and a gate electrode and the drain electrode of said first N-type MOS transistor are connected in common;

a second circuit comprising a plurality of stages each of which comprises a second current source providing a second constant current from a current supply node and a second N-type MOS transistor, wherein said second N-type MOS transistor is connected between the current supply node of said second current source and said ground potential node, and a gate electrode of said second N-type MOS transistor is connected to the gate electrode of said first N-type MOS transistor;

a third constant circuit comprising a first P-type MOS transistor and a third N-type MOS transistor, wherein a drain electrode of said first P-type MOS transistor are connected to a power supply potential node, a gate electrode of said first P-type MOS transistor is connected to a first output node; a drain electrode and said gate electrode of said fmt P-type MOS transistor are connected in common, said third N-type MOS type transistor is connected between source electrode of said first P-type MOS transistor and said ground potential node, and a gate electrode of said third N-type MOS transistor is connected to a gate electrode of said first N-type MOS transistor; and a plurality of diode elements, whose each anode electrode is connected to the source electrode of said first P-type MOS transistor and whose cathode electrode is connected to a drain electrode of said corresponding second N-type MOS transistor; and a fourth circuit comprising a second P-type MOS transistor and a fourth N-type MOS transistor, wherein a drain electrode of said second P-type MOS transistor is connected to said power supply potential node, a gate electrode of said second P-type MOS transistor is connected to a gate electrode of said first P-type MOS transistor, a drain electrode of said fourth N-type MOS transistor is connected to a source electrode of said second P-type MOS transistor, a source electrode of said fourth N-type MOS transistor is connected to said ground potential node, a gate electrode and a drain electrode of said fourth N-type MOS transistor is connected commonly to a second output node, and said ring oscillator core portion comprising odd number of inverter means, each inverter means comprising:

a third P-type MOS transistor whose drain electrode is connected to said power supply potential node and whose gate electrode is connected to the first output node of said current control circuit;

a fourth P-type MOS transistor which is connected between the source electrode of said third P-type MOS transistor and output node of each inverter means, a fifth N-type MOS transistor whose drain electrode is connected to the output node of each inverter means and whose gate electrode is connected to the gate electrode of said fourth P-type MOS transistor; and a sixth N-type MOS transistor connected between a source electrode of said fifth N-type MOS transistor and said ground potential node, a gate electrode of the sixth N-type MOS transistor is connected to the second output node of said current control circuit, wherein a gate electrode of fourth P-type MOS transistor and a gate electrode of N-type MOS transistor of said first stage inverter means are connected to an output node of said last stage inverter means, a gate electrode of fourth P-type MOS transistor and a gate electrode of fifth N-type MOS transistor of succeeding stage of inverter means are connected to an output node of preceding stage of each inverter means.

17. A ring oscillator comprising a current control circuit and a ring oscillator core portion, said current control circuit comprising:

a first circuit comprising a first current source which provides a first constant current from a current supply node and a first N-type MOS transistor whose drain electrode is connected to the current supply node of said first current source and an input terminal, whose source electrode is connected to a ground potential node, and whose gate electrode and the drain electrode are connected in common;

a second circuit comprising a second current source which provides a second constant current from a current supply node and a second N-type MOS transistor which is connected between the current supply node of said second current source and said ground potential node, wherein a gate electrode of said second N-type MOS transistor is connected to the gate electrode of said first N-type MOS transistor;

a third constant circuit comprising a first P-type MOS transistor and a third N-type MOS transistor, wherein a drain electrode of said first P-type MOS transistor is connected to a power supply potential node, a gate electrode and source electrode of said first P-type MOS transistor are connected commonly to a first output node, said third N-type MOS transistor is connected between the source electrode of said first P-type MOS transistor and said ground potential node, and the gate electrode of said third N-type MOS transistor is connected to a gate electrode of said first N-type MOS transistor;

a diode element wherein an anode electrode is connected to source electrode of said first P-type MOS transistor and a cathode electrode is connected to the drain electrode of said second N-type MOS transistor; and a fourth circuit comprising a second P-type MOS transistor and a fourth N-type MOS transistor, wherein a drain electrode of said second P-type MOS transistor is connected to said power supply potential node, a gate electrode of said second P-type MOS transistor is connected to the gate electrode of said first P-type MOS transistor, said fourth N-type MOS transistor is connected between the source electrode of said second P-type MOS transistor and said ground potential node, a gate electrode and a drain electrode of said fourth N-type MOS transistor is commonly connected to a second output node, and a fifth circuit comprising a d&d P-type MOS transistor and a fifth N-type MOS transistor, wherein a drain electrode of said third P-type MOS transistor is connected to said power supply potential node, said fifth N-type MOS transistor is connected between the source electrode of said third P-type MOS transistor and said ground potential node, a gate electrode and a source electrode of said third P-type MOS transistor is connected commonly to a first output node, and a gate electrode of said fifth N-type MOS transistor is connected commonly to the gate electrode of said fourth N-type MOS transistor, and said ring oscillator core portion comprising odd number of inverter means, each inverter means comprising:

a fourth P-type MOS transistor whose drain electrode is connected to said power supply potential node and whose gate electrode is connected to the first output node of said current control circuit;

a fifth P-type MOS transistor which is connected between the source electrode of said fourth P-type MOS transistor and output node of each inverter means;

a sixth N-type MOS transistor whose drain electrode is connected to the output node of each inverter means and whose gate electrode is connected to the gate electrode of said fifth P-type MOS transistor; and a seventh N-type MOS transistor connected between a source electrode of said sixth N-type MOS transistor and said ground potential node, a gate electrode of the seventh N-type MOS transistor is connected to the second output node of said current control circuit wherein a gate electrode of fifth P-type MOS transistor and a gate electrode of sixth N-type MOS transistor of a first stage inverter means are connected to an output node of a last stage inverter means, a gate electrode of said fifth P-type MOS transistor and a gate electrode of sixth N-type MOS transistor of succeeding stage of inverter means are connected to an output node of preceding stage of each inverter means.

18. A ring oscillator comprising a current control circuit and a ring oscillator core portion, said current control circuit comprising a first circuit comprising a first current source which provides a first constant current from a current supply node and a first N-type MOS transistor, wherein a drain electrode of said first N-type MOS transistor is connected to the current supply node of said first current source and an input terminal, a source electrode of said first N-type MOS transistor is connected to a ground potential node, and a gate electrode and the drain electrode of said first N-type MOS transistor are connected in common;

a second circuit comprising a plurality of stages each of which comprises a second current source providing a second constant current from a current supply node and a second N-type MOS transistor, wherein said second N-type MOS transistor is connected between the current supply node of said second current source and said ground potential node, and a gate electrode of said second N-type MOS transistor is connected to the gate electrode of said first N-type MOS transistor;

a third constant circuit comprising a first P-type MOS transistor and a third N-type MOS transistor, wherein a drain electrode of said first P-type MOS transistor is connected to a power supply potential node, a gate electrode of said first P-type MOS transistor is connected to a first output node; a drain electrode and said gate electrode of said first P-type MOS transistor are connected in common, said third N-type MOS type transistor is connected between source electrode of said first P-type MOS transistor and said ground potential node, and a gate electrode of said third N-type MOS transistor is connected to a gate electrode of said first N-type MOS transistor; and a plurality of diode elements, whose each anode electrode is connected to the source electrode of said &st P-type MOS transistor and whose cathode electrode is connected to a drain electrode of said corresponding second N-type MOS transistor;

a fourth circuit comprising a second P-type MOS transistor and a fourth N-type MOS transistor, wherein a drain electrode of said second P-type MOS transistor is connected to said power supply potential node, said fourth N-type MOS transistor is connected between source electrode of said second P-type MOS transistor and said ground potential node, a gate electrode and a drain electrode of said fourth N-type MOS transistor are connected commonly to a second output node, and a fifth circuit comprising a third P-type MOS transistor and a fifth N-type MOS transistor, wherein a drain electrode of said third P-type MOS transistor is connected to said power supply potential node, said fifth N-type MOS transistor is connected between the source electrode of said third P-type MOS transistor and said ground potential node, a gate electrode and a source electrode of said third P-type MOS transistor is connected commonly to a first output node, and a gate electrode of said fifth N-type MOS transistor is connected commonly to the gate electrode of said fourth N-type MOS transistor, and said ring oscillator core portion comprising odd number of inverter means, each inverter means comprising:

a fourth P-type MOS transistor whose drain electrode is connected to said power supply potential node and whose gate electrode is connected to the first output node of said current control circuit;

a fifth P-type MOS transistor which is connected between the source electrode of said fourth P-type MOS transistor and output node of each inverter means;

a sixth N-type MOS transistor whose drain electrode is connected to the output node of each inverter means and whose gate electrode is connected to the gate electrode of said fifth P-type MOS transistor; and a seventh N-type MOS transistor connected between a source electrode of said sixth N-type MOS transistor and said ground potential node, a gate electrode of the seventh N-type MOS transistor is connected to the second output node of said current control circuit wherein a gate electrode of fifth P-type MOS transistor and a gate electrode of sixth N-type MOS transistor of a succeeding stage inverter means are connected to an output node of a last stage inverter means, a gate electrode of fifth P-type MOS transistor and a gate electrode of sixth N-type MOS transistor of succeeding stage of inverter means are connected to an output node of preceding stage of each inverter means.

* * * * *